United States Patent [19]

Seitz

[11] Patent Number: 5,278,500
[45] Date of Patent: Jan. 11, 1994

[54] PLANAR, CORE SATURATION PRINCIPLE, LOW FLUX MAGNETIC FIELD SENSOR

[75] Inventor: Thomas Seitz, Zug, Switzerland

[73] Assignee: Landis & Gyr Betriebs AG, Zug, Switzerland

[21] Appl. No.: 851,443

[22] Filed: Mar. 16, 1992

[30] Foreign Application Priority Data

Apr. 26, 1991 [CH] Switzerland .................. 01262/91-5

[51] Int. Cl.$^5$ .................. G01R 33/02; G01R 33/04; G01R 33/12; G01N 27/82
[52] U.S. Cl. .................. 324/249; 324/239; 324/253
[58] Field of Search ............... 324/249, 253, 254, 255, 324/326, 327, 328, 329, 239, 240; 336/232; 33/361

[56] References Cited

U.S. PATENT DOCUMENTS 3,643,155  2/1972  Riddle et al. .
3,833,872  9/1974  Marcus et al. .
3,848,210  11/1974 Felkner ........................... 336/232
4,864,238  9/1989  Seitz .
4,967,156  10/1990 Seitz .
5,014,006  5/1991  Seitz .

FOREIGN PATENT DOCUMENTS 0284196  2/1988  European Pat. Off. .
3738455  6/1988  Fed. Rep. of Germany .

Primary Examiner—Walter E. Snow
Attorney, Agent, or Firm—Davis Hoxie Faithfull & Hapgood

[57] ABSTRACT

A device is disclosed for measuring low-flux magnetic fields with a sensor operating according to the core saturation principle. The sensor is provided with a ferromagnetic core, an excitation coil and a measuring coil. The measuring coil, the excitation coil and the ferromagnetic core are electrically insulated from one another, each being disposed in a single, separate, parallel layer on a support material.

15 Claims, 4 Drawing Sheets

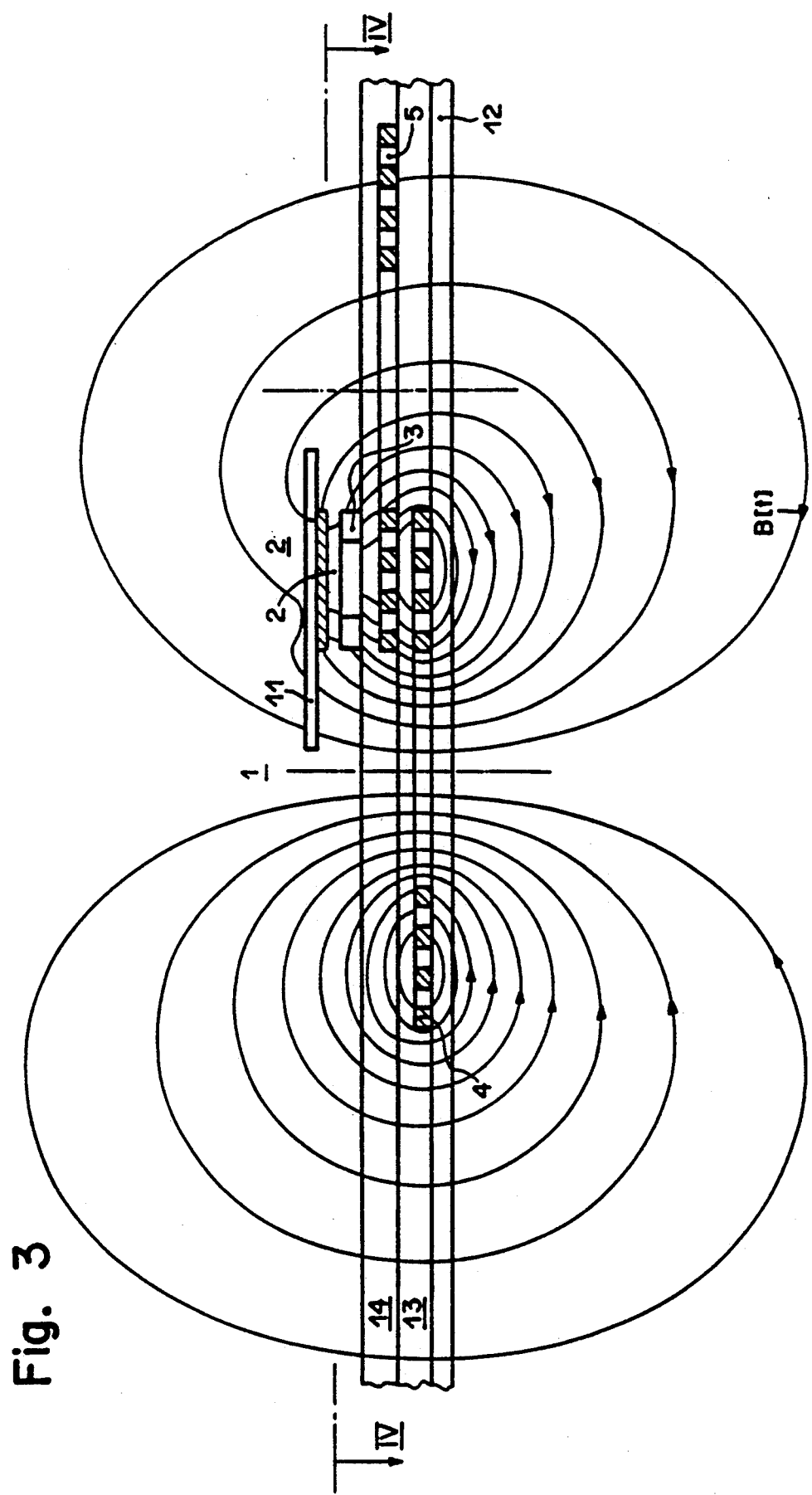

5,278,500

PLANAR, CORE SATURATION PRINCIPLE, LOW FLUX MAGNETIC FIELD SENSOR

RELATED CASE

This application contains subject matter which is related to the subject matter of an application entitled "Planar Harmonic Sensor for Detecting Small Quantity Magnetic Substances" filed for Thomas Sietz on even date herewith and assigned to the assignee hereof. The contents of the related application, which bears Ser. No. 07/851,161, are incorporated herein by reference.

1. Field of the Invention

The present invention relates to sensors for measuring low-flux magnetic fields such as fields produced by the magnetic ink on banknotes.

2. Background of the Invention

A low-flux magnetic field sensor may be used in an automatic banknote recognition machine to detect and/or to read an image printed in magnetic ink on a banknote. Such images are commonly found on U.S., Japanese and German banknotes. For this purpose, the banknote is first magnetized by a strong permanent magnet before detection or reading. A magnetic field, $H_o$, is thus induced in the magnetic ink. However, these fields are typically extremely weak having a value in the order of magnitude of $10^{-3}$ Gauss. By comparison, the ever present Earth's magnetic field has a value of 0.5 Gauss, which is greater by approximately three orders of magnitude.

U.S. Pat. No. 4,864,238 discloses a low-flux magnetic field sensor which comprises an extremely sensitive sensor, operating under the "core saturation principle," to measure the extremely weak magnetic fields produced by the magnetized ink of a banknote. Additionally, an evaluation device, in which a second harmonic of the sensor output voltage is evaluated, is connected to the sensor. This sensor contains a three-dimensional coil which is relatively expensive to manufacture. Further, it is almost impossible to produce two identical sensors. Thus, if two identical sensors are required, the arrangement becomes impossible or significantly more costly to manufacture as the sensors must then be selected from a huge quantity of produced sensors.

It is the object of the present invention to provide an improved low-flux magnetic field sensor which can be manufactured very inexpensively. It is a further object of the present invention to provide a low-flux magnetic field sensor for which a high-precision production of practically identical sensors is possible. An even further object of the present invention is to provide a low-flux magnetic field sensor which dispenses with the need for a filter for filtering out a harmonic from the sensor output voltage in an evaluating device connected to the sensor.

SUMMARY OF THE INVENTION

These and other means are achieved by means of the present invention which is directed to a device for measuring low-flux magnetic fields. The device includes a sensor which has a flat geometry. The sensor operates according to the core saturation principle. To that end, the sensor is provided with a ferromagnetic core, an excitation coil and a measuring coil. The measuring coil, the excitation coil and the ferromagnetic core are electrically insulated from one another and are each located in its own, separate, parallel layer on a support material.

DETAILED DESCRIPTION OF THE DRAWINGS

Examples of embodiments of the invention are shown in the drawing and are described in greater detail below.

FIG. 3 shows a cross-section of a sensor used in the first embodiment of the invention with a banknote.

Identical reference number designate identical parts in all the figures of the drawing.

DESCRIPTION OF THE INVENTION

Figure 1:
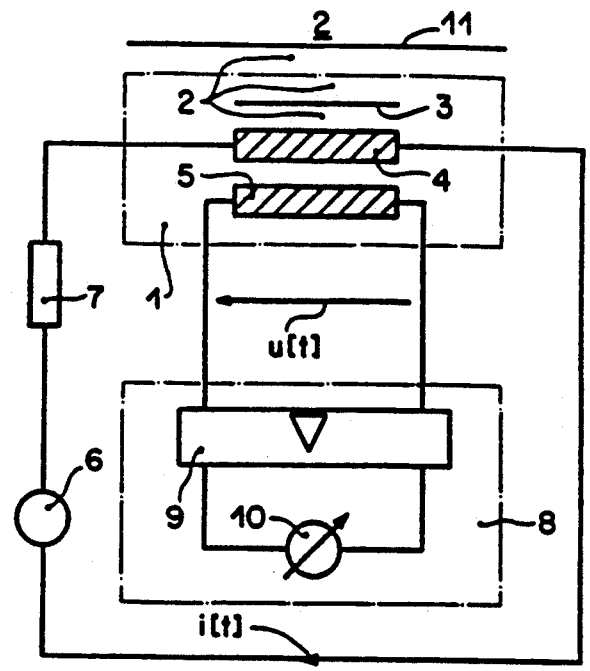
FIG. 1 shows a schematic electrical diagram of a first embodiment of the invention.

The sensor 1 shown in FIG. 1 has a magnetic circuit 2;3 which includes a ferromagnetic core 3 and an air gap 2. The sensor 1 additionally has an excitation coil 4 and a measuring coil 5. The two coils 4 and 5 are inductively coupled together and are located on the same side of core 3. As depicted in FIG. 1, the coils 4, 5 are located on the lower side of the ferromagnetic core 3. A banknote 11, imprinted with magnetized magnetic ink, is temporarily located in the proximity of core 3 within the air gap 2, i.e., on the side of core 3 away from the two coils 4 and 5. Core 3 is a flat core and the banknote 11 is placed so as to be parallel to the core 3 during its evaluation, at a distance up to approximately 1 mm.

A generator 6 supplies the excitation coil 4 via a series resistance 7 with a time-variable excitation current i[t] having a period T. The time-variable excitation current i[t] is preferably a sawtooth-shaped function of time t, but it can also be a different periodic function such as a sinusoid function. However, a sawtooth-shaped excitation current i[t] induces a sawtooth-shaped excitation of the core 3 which produces fewer losses than a sinusoid excitation current i[t] with an equivalent control.

The two terminals of the measuring coil 5 form a two-terminal output of sensor 1 at which an output voltage u[t] appears during the operation of the magnetic field sensor. In FIG. 1, a circuit 8 is provided to evaluate the value of a harmonic of the output voltage u[t] of sensor 1. During the operation of the invention, the output voltage u[t] is applied to the input of the circuit 8 which illustratively comprises an amplifier 9 and a voltmeter 10. In the first embodiment, the amplifier 9 is a band pass amplifier which filters out a harmonic of interest from the frequency spectrum of the output voltage u[t] and amplifies it. The voltmeter 10 is an a.c. voltmeter which preferably measures the effective value of the output voltage of the amplifier 9, i.e., the amplified harmonic that has been filtered out.

The sensor 1 functions on the core saturation principle. Since the latter is known and described in the above-mentioned prior art reference, it is only briefly described below for a better understanding of the present invention.

Figure 2:
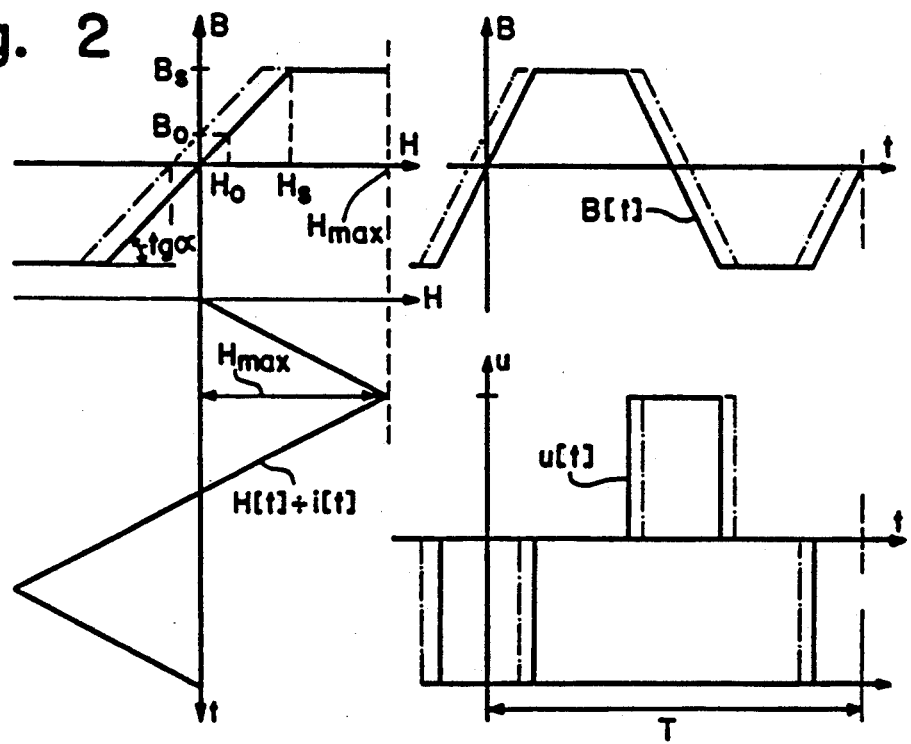
FIG. 2 shows a graphic representation of the core saturation principle.

Referring now to the upper left portion of FIG. 2, an idealized characteristic line B[H] of an effective induction B of the magnetic circuit 2;3 as a function of the magnetic excitation field H[t] (produced by the excitation current i[t]) is graphically shown. For purposes of brevity, the hysteresis of the ferromagnetic core 3 is neglected and the plotted characteristic line is assumed to be linear outside of saturation. In the operation of the invention, the excitation coil 4 is fed with the periodic electrical current i[t] which is sufficiently strong to drive the ferromagnetic core 3 at least temporarily into magnetic saturation. The frequency of the periodic, time-variable excitation current i[t] is preferably 20 to 200 kHz and the measuring coil 5 illustratively has 100 windings. In FIG. 2, $B_s$ designates the saturation induction corresponding to a magnetic saturation field $H_s$. At the lower left of FIG. 2, the magnetic excitation field H[t], which excites the magnetic circuit 2;3, and which is produced in proportion to the excitation current i[t] fed to the excitation coil 4, is plotted as a function of time t. In FIG. 2, it is assumed that the excitation current i[t] and the induced magnetic excitation field H[t] are both sawtooth-shaped functions of time t. The amplitude $H_{max}$ of the sawtooth-shaped magnetic excitation field H[t] is selected to be sufficiently large to periodically drive the ferromagnetic core 3 into saturation. As a result, the corresponding magnetic induction B[t] present in the magnetic circuit 2;3 has a trapezoidal shape with respect to time t (see upper right portion of FIG. 2). The slanted edges of the trapezoidal waveforms produce the periodic voltage u[t] of period T in the measuring coil 5. As depicted in the lower right portion of FIG. 2, the periodic voltage u[t] comprises a series of positive and negative rectangular voltage impulses which alternate over time.

The characteristic lines shown in FIG. 2 by dots and dashes are produced by an external magnetic field $H_o$, such as the magnetic field of the magnetized magnetic ink of a banknote. This external magnetic field H° has a corresponding magnetic induction $B_o$. By virtue of the magnetic induction $B_o$, the rectangular voltage impulses of the output voltage u[t] are distorted with respect to the time axis. This resulting asymmetry can be utilized to measure the value of the outer magnetic field $H_o$. In each instance, the periodic output voltage u[t] comprises (in accordance with a Fourier analysis), a fundamental harmonic assigned the mode number one, and a plurality of continuously numbered harmonics, assigned mode numbers beginning with two. The mode numbers of the fundamental and other harmonics are hereinafter designated by the variable n. If the magnetized magnetic ink of a banknote appears in proximity to the sensor 1, e.g., in the air gap 2, the full spectrum of the harmonics of the output voltage u[t] appears at the sensor 1 output.

According to a Fourier analysis, the amplitude of the n-th harmonic wave is equal to:

$$U_n = [(16H_{max})/(n \cdot \pi \cdot H_s)] \mu_o \cdot \mu_r^* \cdot n_2 \cdot f_1 \cdot F \cdot H_s$$
$$\sin[(n \cdot \pi \cdot H_s)/(2H_{max})] \cdot \sin[(n \cdot \pi/2)(1 + H_o/H_{max})] \quad (1)$$

where $\mu_o$ is the permeability of the vacuum, $\mu_r^*$ is the effective appearing permeability of the magnetic circuit 2;3 (and also the slope $tg\alpha$ of the sensor curve B[H] outside the saturation range, as depicted in FIG. 2), $n_2$ is the number of windings of the measuring coil 5, $f_1$ is the frequency of the fundamental harmonic of the excitation current i[t] (and therefore also the frequency of the fundamental mode of the output voltage u[t]), F is the surface area of a cross-section of the core 3 and $H_{max}$ is the amplitude of the magnetic excitation field H[t].

Figure 4:
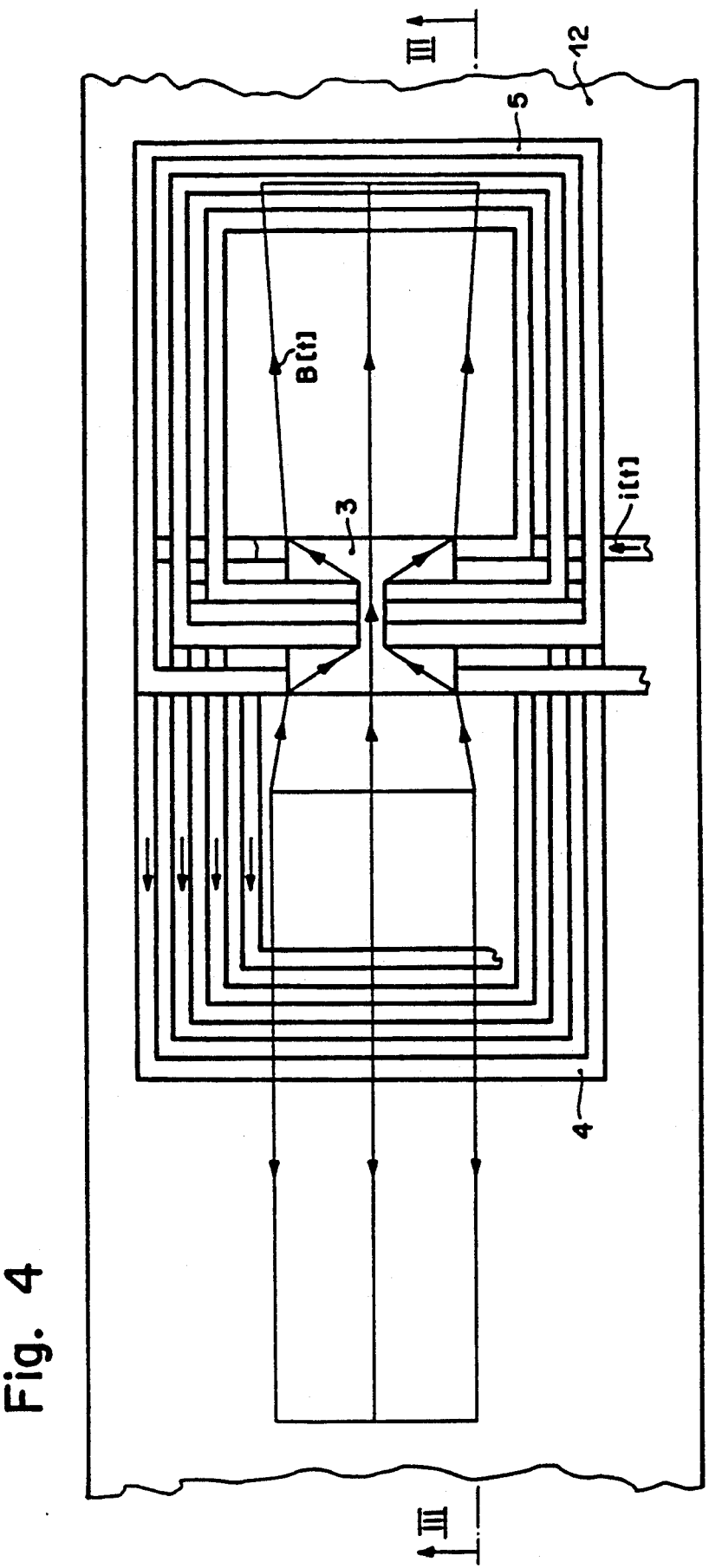
FIG. 4 is a top view of the sensor shown in FIG. 3 with a first core variation.

A first variation of the ferromagnetic core 3 is depicted in FIG. 4. This core 3 is H-shaped with relatively wide main strips and one narrow oblong transverse strip connecting the main strips. If this first core variant is used in conjunction with the first embodiment, then F is the surface area of the cross-section of the transversal strip taken perpendicular to the longitudinal axis of the transversal strip (see FIGS. 3–4). The effective appearing permeability $\mu_r^*$ of the magnetic circuit 2;3 is known to be equal to $1/[N+(1/\mu_r)]$ where N is the so-called demagnetizing (degaussing) factor and $\mu_r$ is the appearing permeability of the ferromagnetic material of core 3.

In the first embodiment, the strongest even-numbered harmonic, i.e., the second harmonic, is extracted from the sensor output voltage u[t] by the amplifier 9. In this case, n=2 and the amplitude of the second harmonic may be calculated from equation (1) as follows $$\begin{aligned}U_2 &= [(16H_{max})/(2\pi \cdot H_s)] \cdot \mu_o \cdot \mu_r^* \cdot n_2 \cdot f_1 \cdot F \cdot \\ &\quad H_s \cdot \sin[\pi \cdot H_s/H_{max}] \cdot \sin[\pi(1 + H_o/H_{max})] \\ &= [8H_{max}/\pi] \cdot \mu_o \cdot \mu_r^* \cdot n_2 \cdot f_1 \cdot F \cdot \sin[\pi \cdot H_s/H_{max}] \cdot \\ &\quad \sin[(\pi \cdot H_o)/H_{max}] \\ &\approx [8H_{max}/\pi] \cdot \mu_o \cdot \mu_r^* \cdot n_2 \cdot f_1 \cdot F \cdot \sin[\pi \cdot H_s/H_{max}] \cdot \\ &\quad [(\pi \cdot H_o)/H_{max}] \\ &\approx 8 \cdot \mu_o \cdot \mu_r^* \cdot n_2 \cdot f_1 \cdot F \cdot H_o \cdot \sin[\pi \cdot H_s/H_{max}], \end{aligned} \quad (2)$$

since $H_o$ is considerably smaller than $H_{max}$.

Referring now to FIGS. 3 and 4, the construction of the sensor 1 is described in greater detail. Preferably, the ferromagnetic core 3, the excitation coil 4 and the measuring coil 5 are constructed so that the sensor 1 is both planar and flat as shown in FIGS. 3 and 4. To that end, the ferromagnetic core 3 is formed as a film layer and both the measuring coil 5 and excitation coil 4 are each formed in separate layers. The measuring coil 5 and the ferromagnetic core 3 are electrically insulated from the other components of the sensor 1 and are placed in two separate, parallel layers on an outer surface of a support material 12 such as a substrate. The support material can be made of ceramic or some other inexpensive and insulating material. Similarly, the excitation coil 4 is also electrically insulated and placed in a separate layer on the outer surface of the support material 12 which is parallel to the layers of the ferromagnetic core 3 and the measuring coil 5.

In FIG. 3 the magnetic ink is shown schematically in form of a black rectangle on the underside of the banknote 11. The two coils 4 and 5 are electrically insulated from each other by a first insulating layer 13. If the measuring coil 5 is rectangular-shaped the excitation coil 4 is preferably also rectangular-shaped. The excitation coil 4 and the measuring coil 5 are disposed in their respective layers so that one fourth of the conductor area of each coil 4 and coil 5 at least partially overlap.

The ferromagnetic core 3 has a thin, nearly constant thickness. It is disposed in a third layer which is parallel to, and formed on, an electrically insulating second insulation layer 14 which, itself, is formed on the layer comprising the single-layer coil 5. The ferromagnetic core 3 is disposed in the third layer so that it at least partially overlaps the overlapping portion of the excitation coil 4 and the measuring coil 5. The air gap 2 of the magnetic circuit 2;3 is defined by the space located outside the upper and lower parallel surfaces of the ferromagnetic core 3.

Figure 5:
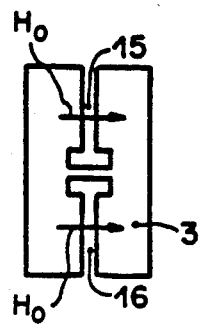
FIG. 5 is a top view of a second core variation.

Referring now to FIG. 5, a second variation of the ferromagnetic core 3 is shown. In this variation, the ferromagnetic core 3 has a rectangular figure eight cross-section, with additional air gaps 15,16 in each of its upper and lower cross-strips. These additional air gaps 15-16 are parallel to each other. The air gaps 15 and 16 together form an operating air gap which can be used to read each of two tracks of magnetic material applied on a banknote which is guided past the sensor 1.

The H-shaped or figure-eight-shaped configuration of the core 3 serve to concentrate the magnetic flux. It is desirable in the preferred embodiment to concentrate the magnetic flux in the middle of core 3 as much as possible in order to reduce the demagnetization factor to the greatest extent. Illustratively, this is achieved using a central transversal strip of the H-shaped or figure-eight-shaped core 3 that is as narrow as possible Illustratively, the width of the central transversal strip is approximately between 0.5 mm and 4 mm. For the same reason, the core thickness t is preferably reduced as much as possible. This can be achieved with especially satisfactory results if the sensor is produced using planar micro-technology. The minimal thickness of the core 3 is preferably approximately 0.025 mm, if produced under a hybrid technology, and approximately 0.5 μm under planar micro-technology. The ferromagnetic core 3 is preferably made of a magnetically amorphous metal which is also known as "magnet glass". Illustratively, the widths of the wide main strips of the H-shaped core 3 are approximately 5 mm and their lengths are 40 to 60 mm.

Using the figure eight shaped core, the sensor not only detects the presence of low-flux magnetic fields, but is also capable of reading the configuration of the magnetic substance. This is because the two outer transversal strips of a figure eight are capable of reading two scan lines of the banknote. Thus, the value of the banknote can be determined very reliably.

Figure 6:
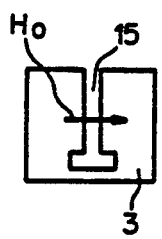
FIG. 6 is a top view of a third core variation.

In a third variation which is shown in FIG. 6, the ferromagnetic core 3 has the configuration of one half of the rectangular eight-shaped cross-section shown in FIG. 5. The configuration of this variation shown in FIG. 6 is that of the upper half of the rectangular figure eight shown in FIG. 5. In other words, the third variation of the ferromagnetic core 3 has the cross-section of a rectangular ring with a single additional air gap 15 positioned at the top. With either the second or third variation of the core 3, the direction of the external low-flux magnetic field $H_o$ is parallel to the widths of the additional air gaps 15 and 16 or of the additional air gap 15 (see FIGS. 5 and 6).

Figure 7:
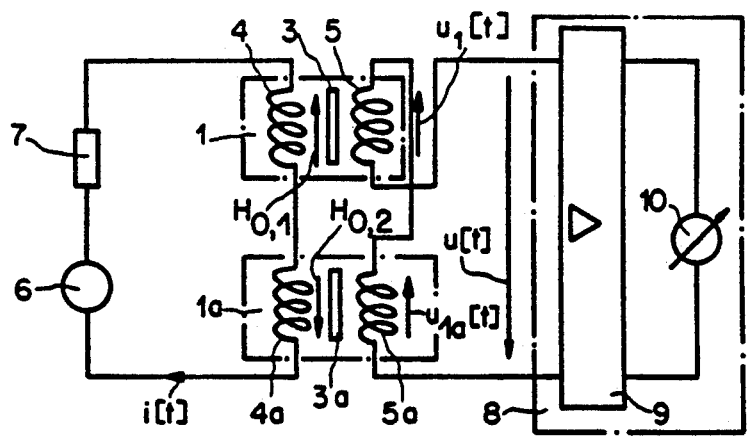
FIG. 7 shows an electrical diagram of a second embodiment of the invention.
Figure 8:
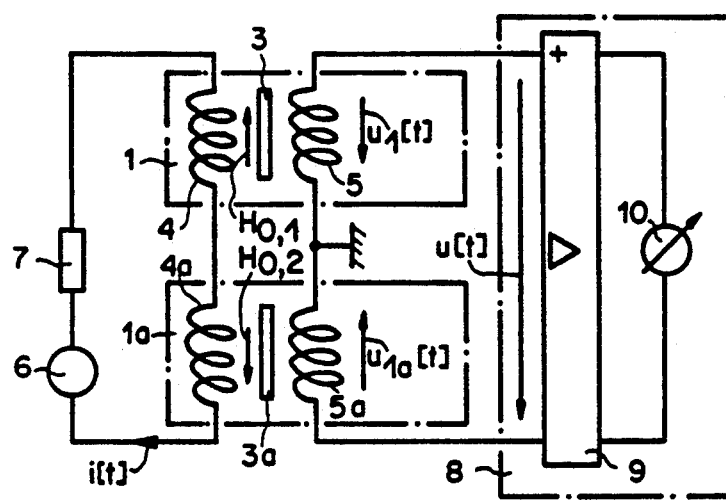
FIG. 8 shows a diagram of a third embodiment of the invention.

Referring now to FIGS. 7 and 8, the second and third embodiments of the present invention will now be discussed. In both arrangements, two identical sensors 1 and 1a together form a double sensor 1;1a. Each sensor 1 and 1a has a separate ferromagnetic core 3 or 3a. Further, the additional sensor 1a has a respective excitation coil 4a and a respective measuring coil 5a.

In both embodiments, the excitation coils 4 and 4a of the two sensors 1 and 1a are connected in series with the same sense. On the other hand, the measuring coils 5 and 5a of the two sensors 1 and 1a are connected to each other so that a difference between their output voltages $u[t] = u_1[t] - u_{1a}[t]$ is formed at the output of the double sensor 1;1a. To achieve this difference, the measuring coils 5 and 5a of the two sensors 1 and 1a are connected in opposite directions in the second embodiment (see FIG. 7). In the third embodiment (see FIG. 8), the measuring coils 5 and 5a of the two sensors 1 and 1a are connected in series with the same sense, but with their common terminal connected to a reference voltage, e.g., the common or ground. Furthermore, in the third embodiment, the other two terminals of the series connection 5;5a of the two measuring coils 5 and 5a are respectively connected to an inverting and a non-inverting input of the amplifier 9.

In both the second and third embodiments, the generator 6 supplies the series connection 4;4a of the excitation coils 4 and 4a, via a series resistance 7, with the time-periodic current i[t]. The current i[t] simultaneously drives the two cores 3 and 3a periodically into saturation. The voltage appearing at the series connection 5;5a of the measuring coils 5 and 5a is the output voltage u[t] of the double sensors 1;1a. The output voltage $u[t] = u_1[t] - u_{1a}[t]$ is fed to the input of the circuit 8. The circuit 8 of the second and third embodiments is similar to that of the first embodiment, with the difference that the amplifier 9 is a wideband amplifier rather than a band pass amplifier.

The second and third embodiments have the advantage that the Earth's magnetic field $H_{Earth}$ is automatically cancelled between the two sensors 3 and 3a. This result follows from the following equation which applies for each harmonic:

$$\begin{aligned} U_n &= [(16H_{max})/(n \cdot \pi)] \cdot \mu_o \cdot \mu_r^* \cdot n_2 \cdot f_1 \cdot \\ &\quad F \cdot \sin[(n \cdot \pi \cdot H_s)/(2H_{max})] \cdot \\ &\quad \{\sin[(n \cdot \pi/2)(1 + H_{Earth}/H_{max})] - \\ &\quad \sin[(n \cdot \pi/2)(1 + H_{Earth}/H_{max})]\} \\ &= 0. \end{aligned}$$

Figure 9:
FIG. 9 shows a schematic cross-section of a sensor used in the second of the invention with a banknote.
Figure 10:
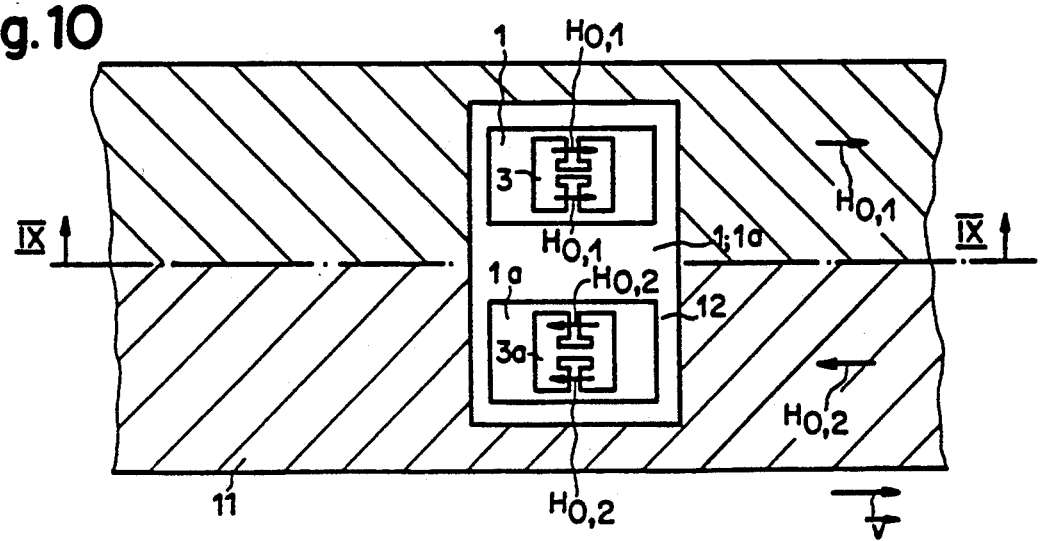
FIG. 10 is a top view of the sensor shown in FIG. 9 with the second core variation.

FIGS. 9 and 10 show the three-dimensional structure of the double sensor 1;1a, with the second variation of the core 3. The two sensors 1 and 1a are installed on the same support material 12 and are nearly parallel. A banknote 11 is moved past and over the double sensor 1;1a with a velocity having a constant speed V and direction parallel to the width of the air gap 15 and 16.

The magnetic ink of a first half of the banknote 11 is moved above the sensor 1 while the magnetic ink of a second half of the banknote 11 is moved above the sensor 1a. These two halves of the banknote 11 represent two bands extending in parallel to the direction of movement of the banknote 11. Thus, the magnetic ink is magnetized in parallel to the direction of movement. If the magnetic poles of the two halves of banknote 11 are aligned in the same sense, the double sensor 1;1a measures a magnetic field difference which is equal to zero, similar to the aforementioned measurement of the Earth magnetic field $H_{Earth}$ (assuming that the magnetic fields of the two banknote halves are of equal size, as is the case except at several measured locations of banknote 11). As a rule, however, two straight locations of banknote 11 measured by the sensors 1 and 1a are magnetized to different degrees since different quantities of magnetic ink are present in each band. Thus, the measured magnetic field difference is generally different from zero. Further, the magnetic ink of the first band of the banknote 11 is preferably magnetized in one perpendicular direction with respect to the banknote's 11 movement while the magnetic ink of the second half of the banknote 11 is preferably magnetized in an opposite perpendicular direction of movement. In other words, if sensor 1 measures a magnetic field $H_{o,1}$ and sensor 1a measures a magnetic field $H_{o,2}$, the two fields $H_{o,1}$, $H_{o,2}$ are oppositely directed.

The last sinus factor in equation (1) can be reduced as follows:

$$\sin[(n \cdot \pi/2)(1 + H_o/H_{max})] = \sin[(n \cdot \pi/2) \cdot \cos[(n \cdot \pi/2)(H_o/H_{max})] + \cos(n \cdot \pi/2) \cdot \sin[(n \cdot \pi/2)(H_o/H_{max})]$$

For even-numbered harmonics the last sinus factor of equation (1) reduces to:

$$(+/-)\sin[(n.\pi/2)(H_o/H_{max})] \qquad (3).$$

Since $u[t] = u_1[t] - u_{1a}[t]$, the amplitudes of the even-numbered harmonics of the output voltage u[t] of the double sensor 1;1a are proportional. Thus, $$\begin{aligned} U_n &= \{(+/-)\sin[(n \cdot \pi/2)(H_{o,1}/H_{max})]\} - \\ &\quad \{(+/-)\sin[(n \cdot \pi/2)(-H_{o,2}/H_{max})]\} \\ &= \{(+/-)\sin[(n \cdot \pi/2)(H_{o,1}/H_{max})]\} + \\ &\quad \{(+/-)\sin[(n \cdot \pi/2)(-H_{o,2}/H_{max})]\} \\ &\approx (+/-)[(n \cdot \pi/2H_{max})(H_{o,1} + H_{o,2})] \end{aligned}$$

since $\sin(-\alpha) = -\sin\alpha$ and both $H_{o,1}$ and $H_{o,2}$ are considerably smaller than $H_{max}$. This means that the measured contributions of the even-numbered harmonics of the two sensors 1 and 1a are added together if two sensors 1 and 1a are precisely identical.

For odd-numbered harmonics on the other hand the last sinus factor of the equation (1) reduces to:

$$(+/-)\cos[(n.\pi/2)(H_o/H_{max})] \qquad (4).$$

The amplitudes of the odd-numbered harmonics of the output voltage u[t] of the double sensor 1; 1a are therefore proportional as with the even-numbered harmonics. Therefore, $$\begin{aligned} U_n &= \{(+/-)\cos[(n \cdot \pi/2)(H_{o,1}/H_{max})]\} - \\ &\quad \{(+/-)\cos[(n \cdot \pi/2)(-H_{o,2}/H_{max})]\} \\ &= \{(+/-)\cos[(n \cdot \pi/2)(H_{o,1}/H_{max})]\} - \\ &\quad \{(+/-)\cos[(n \cdot \pi/2)(H_{o,2}/H_{max})]\} \\ &\approx 0 \end{aligned}$$

since $\cos(-\alpha) = \cos\alpha$ and both $H_{o,1}$ and $H_{o,2}$ are considerably smaller than $H_{max}$. This means that the measured contributions of the odd-numbered harmonics of the two sensors 1 and 1a are subtracted if the two sensors 1 and 1a are precisely identical. In other words, the amplitudes of all odd-numbered harmonics of the output voltage u[t] of the double sensor 1;1a are equal to zero and cancel each other automatically, even without a subsequently added filter. The amplifier 9, therefore, no longer requires any filter action and functions as a wideband amplifier.

Thick-film technology is similar to integrated circuit technology in that a plurality of cores and coils can only be fabricated on a single substrate using batch processing with photo-lithographic masks. As such, the production of the sensors 1, 1a and 1;1a is very inexpensive and extremely precise. The sensors 1 and 1a can be made nearly identical to each other because the geometric dimensions of the coils and of the cores can be made very precisely using the above technique and the three-dimensional assembly of the coils and cores is no longer required. To compensate for the interfering harmonics it is furthermore essential that the ferromagnetic cores 3 and 3a of the two sensors 1 and 1a have the same coercive magnetic field strengths. This may be achieved by fabricating the ferromagnetic cores 3 and 3a from magnet glass, since magnet glass has a practically negligible coercive magnetic field strength of 4 mA/cm.

Finally, the above-mentioned embodiments are intended to be merely illustrative of the invention. Numerous other embodiments maybe devised by those ordinarily skilled in the art without departing from the spirit and scope of the following claims.

I claim:

1. A device for measuring low-flux magnetic fields comprising a sensor having a flat geometry which operates according to the core saturation principle and comprises:
   a ferromagnetic core disposed entirely in a first continuous, uninterrupted layer,
   an excitation coil magnetically coupled to said core and disposed entirely in a second continuous, uninterrupted layer,
   a measuring coil magnetically coupled to said core and disposed entirely in a third, continuous, uninterrupted layer, and
   a support layer on which said first, second and third layers are disposed, said first, second and third layers being located in separate, parallel planes.

2. The device of claim 1 wherein both said measuring coil and said excitation coil have a rectangular spiral geometry, said coils being disposed in their separate layers so that one fourth of each of said coils at least partially overlap each other.

3. The device of claim 2 wherein said ferromagnetic core is disposed in its layer so that it at least partially overlaps the overlapping portion of said measuring coil and said excitation coil.

4. The device of claim 1 wherein said ferromagnetic core is H-shaped.

5. The device of claim 1 wherein said ferromagnetic core is rectangular figure eight shaped with a gap in its uppermost and bottommost cross-strips.

6. The device of claim 1 wherein said ferromagnetic core is rectangular-ring shaped with a gap.

7. The device of claim 1 wherein said ferromagnetic core comprises a magnet glass material.

8. The device according to claim 1 comprising a double sensor which comprises said first sensor and a second sensor nearly identical to, and arranged in parallel with, said first sensor, each of said sensors having an excitation coil and a measurement coil, the excitation coils of the first and second sensors being connected in series with the same sense and the measuring coils of the first and second sensors connected in series to produce a difference in measured voltages from each of said sensors, said difference in voltage forming an output of the double sensor.

9. The device of claim 8 wherein the measuring coils of said first and second sensors are connected in series with opposite senses.

10. The device of claim 8 wherein the measuring coils of said first and second sensors are connected in series, the common terminals of said measuring coil being additionally connected to a reference voltage and the other terminal of each sensor respectively connected to an inverting and non-inverting input of an amplifier.

11. A device for measuring low-flux magnetic fields including a sensor comprising
- a first nonferromagnetic layer comprising a first planar spiral conductor and a first layer of insulation material formed on top of said first spiral conductor,
- a second nonferromagnetic layer comprising a second planar spiral conductor and a second layer of insulation material formed on top of said second spiral conductor,
- said first and second layers being stacked directly on top of one another
- a third layer comprising a planar magnetic core and,
- a layer of support material on which said first, second and third layers are disposed,
- said first and second spiral conductors being magnetically coupled to said core, with one of said spiral conductors serving as an entire excitation coil for driving said core into saturation and with the other of said spiral conductors serving as an entire measuring coil.

12. The device of claim 11 wherein said first, second and third layers are continuous, uninterrupted layers.

13. The device of claim 1 wherein said second and third layers are non-ferromagnetic layers which are stacked directly on top of one another.

14. A device for detecting the presence of a magnetic substance having a planar geometry comprising:
- a sensor which operates according to the core saturation principle and which includes a magnetic circuit having a ferromagnetic core, disposed entirely in a first, continuous, uninterrupted layer, and an air gap;
- an excitation coil, disposed entirely in a second, continuous, uninterrupted layer, magnetically coupled to said magnetic circuit, for periodically driving said ferromagnetic core into saturation; and
- a measuring coil, disposed entirely in a third, continuous, uninterrupted layer, magnetically coupled to said magnetic circuit, for measuring an effective appearing permeability of the magnetic circuit to detect a change in said effective appearing permeability when the magnetic substance is located in said air gap of said magnetic circuit,
- said ferromagnetic core, said excitation coil and said measuring coil being insulated from one another wherein said first, second and third layers are located in separate, parallel planes.

15. The device of claim 14 wherein each of said excitation and measuring coils comprises a single spiral conductor disposed on a non-ferromagnetic layer and wherein said non-ferromagnetic layers are stacked directly on top of one another.

* * * * *